United States Patent
Iwama

(10) Patent No.: US 9,706,643 B2
(45) Date of Patent: Jul. 11, 2017

(54) ELECTRONIC DEVICE AND METHOD FOR MANUFACTURING THE SAME

(71) Applicant: Panasonic Intellectual Property Management Co., Ltd., Osaka (JP)

(72) Inventor: Tomoko Iwama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 31 days.

(21) Appl. No.: 14/727,892

(22) Filed: Jun. 2, 2015

(65) Prior Publication Data

US 2015/0373851 A1    Dec. 24, 2015

(30) Foreign Application Priority Data

Jun. 19, 2014    (JP) .................................. 2014-126481

(51) Int. Cl.
*H05K 1/02*    (2006.01)
*H05K 1/18*    (2006.01)
(Continued)

(52) U.S. Cl.
CPC ........... *H05K 1/0271* (2013.01); *H05K 1/187* (2013.01); *H05K 1/188* (2013.01); *H05K 3/0014* (2013.01);
(Continued)

(58) Field of Classification Search
CPC .. H05K 1/0271; H05K 3/0014; H05K 3/4614; H05K 1/187; H05K 1/188;
(Continued)

(56) References Cited

U.S. PATENT DOCUMENTS

2008/0224282 A1* 9/2008 Ashida .................. H01L 21/565
257/669
2009/0039498 A1* 2/2009 Bayerer .............. H01L 23/3735
257/700

(Continued)

FOREIGN PATENT DOCUMENTS

JP    2004-281701    10/2004
JP    2006-005292    1/2006

(Continued)

*Primary Examiner* — Adrian S Wilson
*Assistant Examiner* — Abishek Rathod
(74) *Attorney, Agent, or Firm* — McDermott Will & Emery LLP

(57) ABSTRACT

An electronic device according to the present disclosure includes a component, an electrode placed on the component, a conductor which includes a first conductor section, including an electrode contact surface in contact with the electrode, and two second conductor sections, electrically connected to two respective facing edges of the first conductor section to extend in respective directions away from the electrode and including respective inclined surfaces inclined in directions toward a central axis passing through a center of the electrode and perpendicular to the surface of the electrode, an insulator which is in contact with the two second conductor sections from sides opposite to the central axis and encloses the conductor and the electrode, and a case housing the component, the electrode, the conductor, and the insulator. A space without the insulator is defined between the two second conductor sections.

13 Claims, 12 Drawing Sheets

(51) Int. Cl.
*H05K 3/00* (2006.01)
*H05K 3/46* (2006.01)

(52) U.S. Cl.
CPC ...... *H05K 3/4614* (2013.01); *H01L 2924/181* (2013.01); *H05K 2201/0133* (2013.01); *H05K 2201/037* (2013.01); *H05K 2201/0338* (2013.01); *H05K 2201/0382* (2013.01); *H05K 2201/068* (2013.01); *H05K 2201/09736* (2013.01); *H05K 2203/063* (2013.01); *H05K 2203/1327* (2013.01); *Y10T 29/49131* (2015.01)

(58) Field of Classification Search
CPC . H05K 2201/09736; H05K 2201/0338; H05K 2203/1327; H05K 2201/0133; H05K 2201/0382; H05K 2203/063; H05K 2201/037; Y10T 29/49131; Y10T 29/49131; H01L 2924/181
See application file for complete search history.

(56) References Cited

U.S. PATENT DOCUMENTS

| | | | |
|---|---|---|---|
| 2009/0183911 A1* | 7/2009 | Sunohara | H05K 3/4092 174/267 |
| 2011/0266686 A1 | 11/2011 | Yamaguchi | |
| 2012/0187554 A1 | 7/2012 | Oka et al. | |
| 2012/0243281 A1 | 9/2012 | Miyake | |

FOREIGN PATENT DOCUMENTS

| | | |
|---|---|---|
| JP | 2009-267246 | 11/2009 |
| JP | 2010-103222 | 5/2010 |
| JP | 2011-233753 | 11/2011 |
| JP | 2012-142466 | 7/2012 |
| JP | 2012-151019 | 8/2012 |
| JP | 2012-199469 | 10/2012 |
| JP | 2013-125804 | 6/2013 |

* cited by examiner

ELECTRONIC DEVICE AND METHOD FOR MANUFACTURING THE SAME

BACKGROUND

1. Technical Field

The present disclosure relates to an electronic device and a method for manufacturing the electronic device. The present disclosure relates more particularly to an electronic device with a pressure-contact electric connection terminal structure and a method for manufacturing the electronic device.

2. Description of the Related Art

A power converter including a power semiconductor device is mounted on a household appliance, a power conditioner, industrial equipment, an electric vehicle, a railroad vehicle, or the like. This power converter is composed of a converter circuit, an inverter circuit, or the like. Since the power converter handles a large current of several A or more and high power, a power semiconductor device is used as a circuit component. Power semiconductor devices include a component (which is generally several centimeters square and several millimeters thick), such as a transistor or a diode in bare chip form made of, for example, Si, SiC, or GaN. Examples of a packaged form of such a component include a discrete component and a power module.

A description will be given of the configuration of a power converter including a power semiconductor device, particularly the general structure of a power module.

A general power module includes a board, and a power semiconductor device is electrically connected to the board by bonding the power semiconductor device to wiring of or a support for the board through die bonding. For the connection, solder joining is generally used. A conductor, such as wiring of the board, a lead frame, or a terminal, is electrically connected to an electrode on a surface on the other side of the power semiconductor device by a conductive wire. Wire bonding is mainly used for the connection. A structure formed through the above-described connection is housed in an insulative case except for an external terminal.

During operation, a current of several A to several thousands of A or more flows through the power semiconductor device to generate heat. The heat generation raises not only the temperature of the power semiconductor device but also the temperature of a device including the power semiconductor device to a high temperature of, for example, several tens of ° C. to 100° C. or more. A metal conductor included in the device including the power semiconductor device increases in electric resistance and becomes more likely to generate heat with increase in temperature. If the device has low heat dissipation, and the temperature inside the device remains high and is slow to drop, the electric resistances of the power semiconductor device and the conductor increase to generate more heat. This leads to the vicious cycle of the temperature inside the device rising increasingly. In some cases, the power semiconductor device may be thermally destructed or resin may degrade due to thermal fatigue or may be brought to stress rupture due to thermal expansion. For this reason, the device including the power semiconductor device needs high heat resistance and a high heat dissipation technique.

The melting temperature of solder used for connection of the electrode on one surface of the power semiconductor device is about 130° C. to 300° C. The temperature of a joint of the power semiconductor device is 100° C. or more during operation, and solder may melt to cause poor reliability. A bonding wire used to connect the electrode on the other surface of the power semiconductor device is also used as a path for heat dissipation from the power semiconductor device. Since the bonding wire is in contact with only a part of the surface of the power semiconductor device and has a small diameter, the bonding wire has low heat dissipation.

From the foregoing, it can be seen that high heat resistance and a high heat dissipation connection technique are important in an electronic device including a semiconductor, such as a power semiconductor device, or a component, such as a passive component. Under the circumstances, a pin connection technique is being developed as a connection structure in a power semiconductor device (see, for example, Japanese Unexamined Patent Application Publications Nos. 2009-267246, 2012-151019, and 2013-125804).

In the electronic device in any of Japanese Unexamined Patent Application Publications Nos. 2009-267246, 2012-151019, and 2013-125804, members in the device are connected using an elongated pin, and heat is dissipated through transfer of heat via the pin.

SUMMARY

In one general aspect, the techniques disclosed here feature an electronic device including at least one component, an electrode which is placed on the at least one component, a conductor which includes a first conductor section and two second conductor sections, the first conductor section including an electrode contact surface in contact with the electrode along a surface of the electrode, the two second conductor sections being electrically connected to two respective edges facing each other of the first conductor section to extend in respective directions away from the electrode and including respective inclined surfaces inclined in directions toward a central axis passing through a center of the electrode and perpendicular to the surface of the electrode, an insulator which is in contact with the two second conductor sections from sides opposite to the central axis and encloses the conductor and the electrode, and a case which houses the at least one component, the electrode, the conductor, and the insulator, in which a space where the insulator is not arranged is defined between the two second conductor sections.

An electronic device and a method for manufacturing the electronic device according to the present disclosure allow enhancement of the reliability of an electronic device during component operation.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
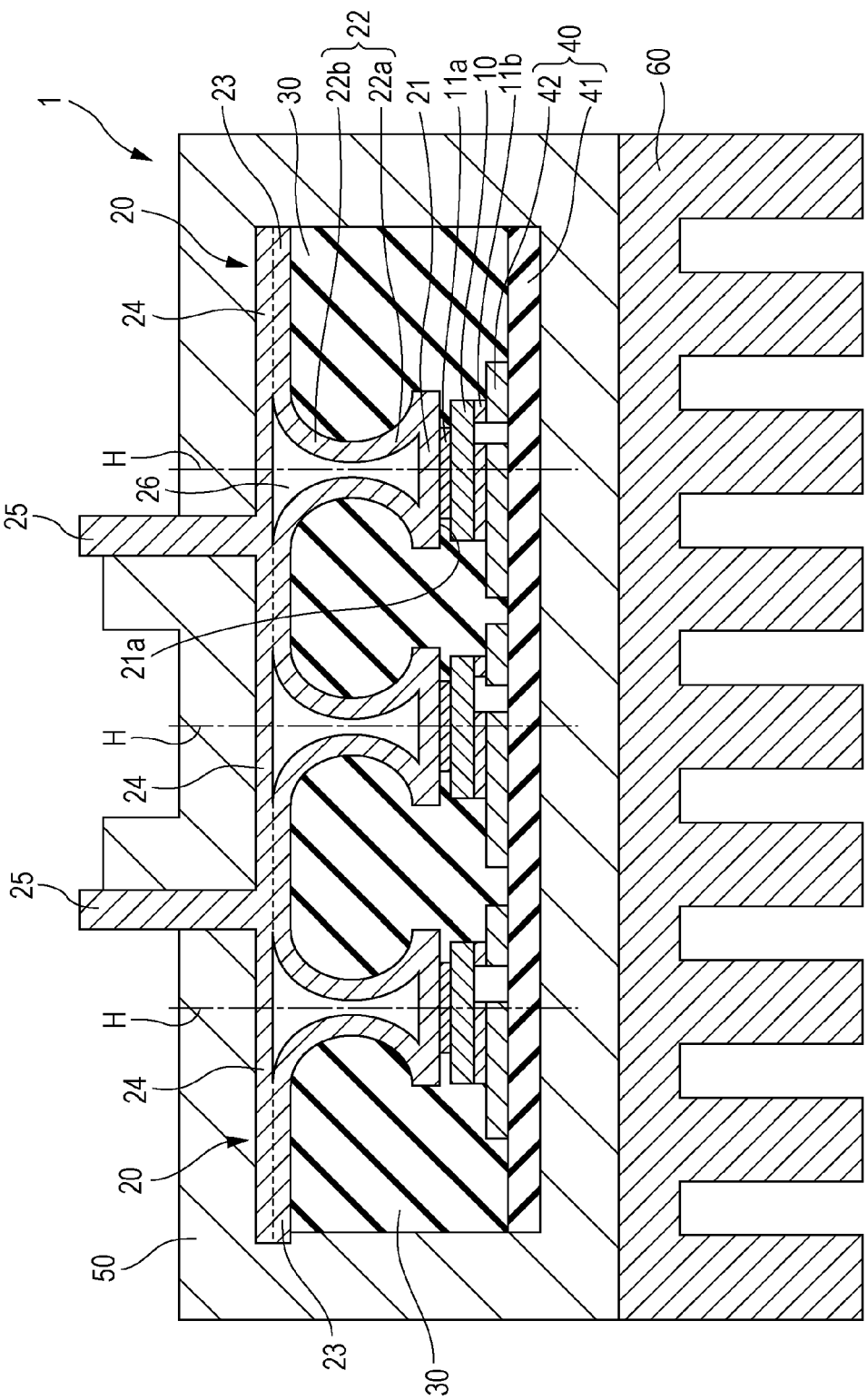
FIG. 1 is a cross-sectional view of an electronic device according to a first embodiment of the present disclosure.

In an electronic device using a conventional pin-based connection method, the temperature inside the electronic device becomes high during component operation. It is difficult to know in which directions stresses act when members including a pin expand. Especially if a stress acts to impair the condition of contact of the pin with an electrode, the reliability of the electronic device may decrease. As described above, there is still room for improvement in the reliability of an electronic device, particularly during component operation.

The present disclosure can enhance the reliability of an electronic device during component operation.

According to a first aspect of the present disclosure, there is provided an electronic device including at least one component, an electrode which is placed on the at least one component, a conductor which includes a first conductor section and two second conductor sections, the first conductor section including an electrode contact surface in contact with the electrode along a surface of the electrode, the two second conductor sections being electrically connected to two respective edges facing each other of the first conductor section to extend in respective directions away from the electrode and including respective inclined surfaces inclined in directions toward a central axis passing through a center of the electrode and perpendicular to the surface of the electrode, an insulator which is in contact with the two second conductor sections from sides opposite to the central axis and encloses the conductor and the electrode, and a case which houses the at least one component, the electrode, the conductor, and the insulator, in which a space where the insulator is not arranged is defined between the two second conductor sections.

According to a second aspect of the present disclosure, there is provided the electronic device according to the first aspect, in which a coefficient of thermal expansion of the case is lower than a coefficient of thermal expansion of the conductor and is lower than a coefficient of thermal expansion of the insulator.

According to a third aspect of the present disclosure, there is provided the electronic device according to the first aspect, further including an auxiliary conductor which is provided in the space and is in contact with the first conductor section.

According to a fourth aspect of the present disclosure, there is provided the electronic device according to any one of the first to third aspects, further including a board which is electrically connected to the at least one component and supports the at least one component, in which the conductor further includes a third conductor section which is electrically connected to an end on a side opposite to a connection with the first conductor section of each of the two second conductor sections to extend in a direction away from the central axis and faces the board, and the insulator is arranged between the board and the third conductor section.

According to a fifth aspect of the present disclosure, there is provided the electronic device according to the fourth aspect, in which the at least one component, the electrode, the conductor, the insulator, and the board compose each of at least two structures, the conductor further includes a fourth conductor section which electrically connects the third conductor sections of the at least two structures, and the at least two structures are arranged symmetrically with respect to the fourth conductor section.

According to a sixth aspect of the present disclosure, there is provided the electronic device according to any one of the first to the fifth aspects, in which a coefficient of thermal expansion of the insulator is higher than a coefficient of thermal expansion of the conductor.

According to a seventh aspect of the present disclosure, there is provided the electronic device according to any one of the first to the sixth aspects, in which the at least one component comprises a plurality of components, and the first conductor section extends in a direction, in which the plurality of components are arrayed, and is electrically connected to the plurality of components.

According to an eighth aspect of the present disclosure, there is provided the electronic device according to any one of the first to the seventh aspects, in which a thickness of each of the two second conductor sections is smaller than a thickness of the first conductor section.

According to a ninth aspect of the present disclosure, there is provided the electronic device according to any one of the first to the eighth aspects, in which each of the respective inclined surfaces is flat.

According to a tenth aspect of the present disclosure, there is provided the electronic device according to any one of the first to the eighth aspects, in which each of the respective inclined surfaces is curved.

According to an 11th aspect of the present disclosure, there is provided a method for manufacturing an electronic device including at least one component, an electrode, a conductor, and an insulator, including bringing a first conductor section of the conductor into contact with the electrode placed on the at least one component along a surface of the electrode, forming respective inclined surfaces which are inclined in directions toward a central axis passing through a center of the electrode and perpendicular to the surface of the electrode at two second conductor sections of the conductor which are electrically connected to two respective edges facing each other of the first conductor section to extend in respective directions away from the electrode, enclosing the conductor and the electrode while bringing the insulator into contact with the two second conductor sections from sides opposite to the central axis, and housing the at least one component, the electrode, the conductor, and the insulator in a case, in which a space where the insulator is not arranged is defined between the two second conductor sections.

According to a 12th aspect of the present disclosure, there is provided the method for manufacturing the electronic device according to the 11th aspect, in which a coefficient of thermal expansion of the case is lower than a coefficient of thermal expansion of the conductor and is lower than a coefficient of thermal expansion of the insulator.

According to a 13th aspect of the present disclosure, there is provided the method for manufacturing the electronic device according to the 11th aspect, further including providing an auxiliary conductor which is in contact with the first conductor section in the space.

According to a 14th aspect of the present disclosure, there is provided the method for manufacturing the electronic device according to any one of the 11th to the 13th aspects, further including preparing a board which supports the at least one component, and arranging the board so as to face a third conductor section of the conductor which is electrically connected to an end on a side opposite to a connection with the first conductor section of each of the two second conductor sections to extend in a direction away from the central axis, in which the step of enclosing the conductor and the electrode in the insulator includes arranging the insulator between the board and the third conductor section.

According to a 15th aspect of the present disclosure, there is provided the method for manufacturing the electronic device according to the 14th aspect, further including preparing at least two structures which are each composed of the at least one component, the electrode, the conductor, the insulator, and the board, connecting the third conductor sections of the at least two structures electrically by a fourth conductor section, and arranging the at least two structures symmetrically with respect to the fourth conductor section.

According to a 16th aspect of the present disclosure, there is provided the method for manufacturing the electronic device according to any one of the 11th to the 15th aspects, in which the at least one component comprises a plurality of components, and the step of bringing the first conductor section into contact with the electrode includes connecting the first conductor section to the plurality of components.

According to a 17th aspect of the present disclosure, there is provided the method for manufacturing the electronic device according to any one of the 11th to the 16th aspects, further including curing the insulator that encloses the conductor.

First and second embodiments of the present disclosure will be described below with reference to the drawings.

(First Embodiment)

FIG. 1 shows an electronic device 1 according to a first embodiment. In the first embodiment, as an example of the electronic device 1, the electronic device 1 as a semiconductor device including a power semiconductor device will be described. The electronic device 1 shown in FIG. 1 includes a power semiconductor device 10, a conductor-side electrode 11a, a board-side electrode 11b, a conductor 20, an insulator 30, a board 40, a case 50, and a heat sink 60. In the electronic device 1, the power semiconductor device 10, the conductor-side electrode 11a, the board-side electrode 11b, the conductor 20, and the board 40 are electrically connected inside the case 50, and the insulator 30 encloses the members. Note that FIG. 1 shows, as an example, a configuration in which three structures, each composed of the power semiconductor device 10, the conductor-side electrode 11a, the board-side electrode 11b, and the like, are arranged in a lateral direction.

The power semiconductor device 10 is an example of a component in the electronic device 1. Examples of a power semiconductor device include a bear chip component, such as a transistor or a diode made of, for example, Si, SiC, or GaN. A component in the electronic device 1 is not limited to a power semiconductor device and may be a passive component or the like. Examples of a passive component include a thin resistor, a capacitor, and an inductor. A component may be not only a power semiconductor device or a passive component but also a component, such as an IC chip, an LSI chip, or a sensor of every type. Any component may be adopted as long as the component is an electronic component, such as an active component or a mechanical component.

The conductor-side electrode 11a and the board-side electrode 11b are both electrodes attached to the power semiconductor device 10. The conductor-side electrode 11a is arranged on a surface on the side closer to the conductor 20 (an upper surface in the first embodiment) of surfaces of the power semiconductor device 10 while the board-side electrode 11b is arranged on a surface on the side closer to the board 40 (a lower surface in the first embodiment) of the surfaces of the power semiconductor device 10. The first embodiment assumes use of a MOS-FET with respective thin rectangular flat electrodes attached to the upper and lower surfaces of the power semiconductor device 10. Note that although the conductor-side electrode 11a and the board-side electrode 11b are both planarly formed in FIG. 1, the conductor-side electrode 11a and the board-side electrode 11b may have generally flat shapes. For example, the conductor-side electrode 11a and the board-side electrode 11b may be partially curved.

The conductor 20 is a conductor which is connected to the conductor-side electrode 11a and allows electrical connection of the power semiconductor device 10 to the outside via the conductor-side electrode 11a. The conductor 20 includes a first conductor section 21, a second conductor section 22, a third conductor section 23, a fourth conductor section 24, and a fifth conductor section 25. The configuration of the members will be described below.

The first conductor section 21 is a conductor section which extends in a direction parallel to a surface of the conductor-side electrode 11a (a horizontal direction in the first embodiment) along the surface of the conductor-side electrode 11a. The first conductor section 21 includes, as a lower surface, an electrode contact surface 21a in contact with the surface of the conductor-side electrode 11a. The electrode contact surface 21a is arranged so as to be in contact with the whole surface of the conductor-side electrode 11a and extends so as to protrude slightly in the horizontal direction from a periphery of the surface of the conductor-side electrode 11a. That is, the surface area of the electrode contact surface 21a is set to be slightly larger than that of a contact surface of the conductor-side electrode 11a. Note that although the first embodiment illustrates a case where the surface area of the electrode contact surface 21a is larger than that of the conductor-side electrode 11a, the present disclosure is not limited to this case. The surface area of the electrode contact surface 21a may be smaller than or equal to that of the conductor-side electrode 11a.

The second conductor section 22 is a conductor section which extends from an edge of the first conductor section 21. As shown in FIG. 1, the second conductor sections 22 extend upward, that is, in a direction away from the conductor-side electrode 11a from two edges in the horizontal direction (two facing edges) of each first conductor section 21. The second conductor sections 22 are curved so as to be concave inward. More specifically, the second conductor section 22 includes a lower inclined surface 22a and an upper inclined surface 22b. The lower inclined surface 22a is inclined from the corresponding edge of the first conductor section 21 in a direction toward a central axis H passing through a center of the conductor-side electrode 11a and perpendicular to the surface of the conductor-side electrode 11a. The upper inclined surface 22b is inclined in a direction opposite to the direction, in which the lower inclined surface 22a is inclined. The insulator 30 is not arranged between the two right and left second conductor sections 22 that extend from the two edges of the first conductor section 21 and face each other. A hollow space 26 which is empty is formed between the two right and left second conductor sections 22.

The third conductor section 23 is a conductor section which extends from the second conductor section 22. As shown in FIG. 1, the third conductor section 23 is connected to an end on the side opposite to a connection with the first conductor section 21 of the second conductor section 22 (an upper end in FIG. 1) and extends in a direction away from the central axis H of the conductor-side electrode 11a. The third conductor section 23 is arranged so as to face the board 40 and extends in a direction parallel to the conductor-side electrode 11a and a surface of the board 40. As shown in FIG. 1, in the three structures that are arranged in the lateral direction and each include the power semiconductor device 10 and the like, the third conductor sections 23 are connected to each other between adjacent ones of the structures. With this connection, all of the three power semiconductor devices 10 arranged in the horizontal direction are electrically connected via the conductor-side electrodes 11a and the conductor 20.

The fourth conductor section 24 is a conductor section which is arranged so as to be in contact with the third conductor section 23 from above. As shown in FIG. 1, the fourth conductor section 24 is arranged so as to be in contact with all of the third conductor sections 23 inside the electronic device 1. The fourth conductor section 24 is arranged so as to extend along an inner upper surface of the case 50.

The fifth conductor section 25 is an external terminal section for connecting the conductor 20 to the outside and extends upward from the fourth conductor section 24 to outside the case 50. When the fifth conductor section 25 is to be connected to the fourth conductor section 24, the fifth conductor section 25 may be connected by joining, such as pressure contact, welding, or the like.

The conductor 20 with the above-described configuration may be made of a copper plate plated with nickel or gold. Alternatively, the conductor 20 may be formed by shaping a copper plate and then plating the first conductor section 21 with nickel or gold. Not only the first conductor section 21 but also another portion (for example, the third conductor section 23 and the fourth conductor section 24) of the conductor 20 may be plated. The conductor 20 may be made of a metal in the form of a plate (for example, gold, silver, copper, platinum, aluminum, nickel, zinc, tin, or vanadium, in particular), an alloy based on any metal, or a material plated with any metal.

The insulator 30 is an insulative encloser which encloses the power semiconductor device 10, the conductor-side electrode 11a, the board-side electrode 11b, the conductor 20, and the like and is arranged inside the electronic device 1. As shown in FIG. 1, the insulator 30 is arranged inside the case 50 so as to enclose all of the power semiconductor device 10, the conductor-side electrode 11a, the board-side electrode 11b, the conductor 20, and the board 40. The insulator 30 is in close contact with the first conductor section 21, the second conductor section 22, and the third conductor section 23 of the conductor 20. In the first embodiment, an insulative resin (for example, epoxy resin), silicone, rubber, or the like as used in electrical equipment and an electronic device is used as the insulator 30. Among these materials, a material with high elasticity and a high coefficient of thermal expansion may be used. In the first embodiment, a material higher in coefficient of thermal expansion than the conductor 20 is used as the material for the insulator 30.

Figure 2A:
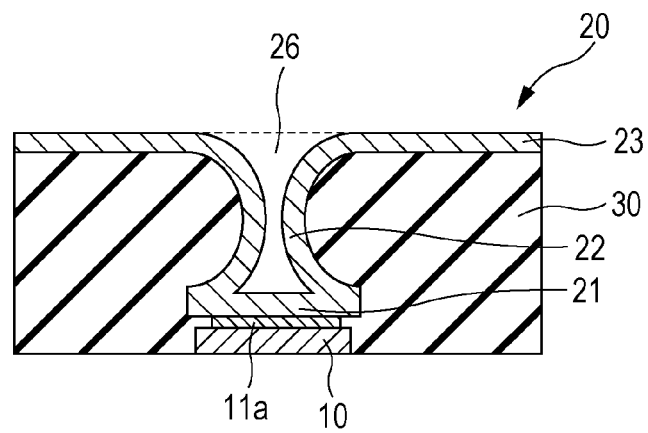
FIG. 2A is a cross-sectional view of a conductor and an insulator of the electronic device according to the first embodiment.
Figure 2B:
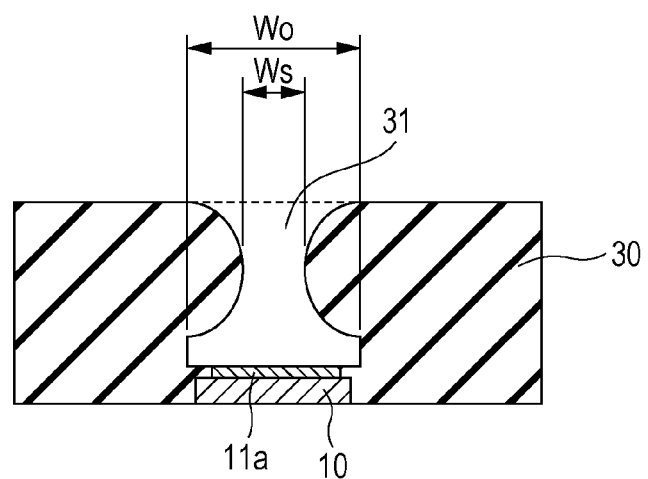
FIG. 2B is a cross-sectional view of the insulator of the electronic device according to the first embodiment.

The relationship between the conductor 20 and the insulator 30 described above will be described with reference to FIGS. 2A and 2B. FIG. 2A is a view of the power semiconductor device 10, the conductor-side electrode 11a, the conductor 20 (the first conductor section 21, the second conductor section 22, and the third conductor section 23), and the insulator 30 as an extract from the configuration of the electronic device 1. FIG. 2B is a view after the conductor 20 is omitted from FIG. 2A. As shown in FIG. 2B, the insulator 30 has an opening section 31 which extends from an upper surface of the insulator 30 to the surface of the conductor-side electrode 11a. The opening section 31 is open such that the first conductor section 21 and the second conductor sections 22 of the conductor 20 are arranged therein. The cross-sectional shape of the opening section 31 is a taper shape which decreases in width toward a central portion in a vertical direction. More specifically, in a width in the lateral direction of the opening section 31, a width Wo at each end in the vertical direction is the largest while a width Ws at the central portion is the smallest. As shown in FIG. 2A, the first conductor section 21 is arranged at a bottom of the opening section 31, the second conductor section 22 is arranged at a curved side portion of the opening section 31, and the third conductor section 23 is arranged so as to extend along the upper surface of the insulator 30.

Note that locations inside the electronic device 1 where the insulator 30 is arranged are regions surrounded by the second conductor sections 22, the third conductor sections 23, the board 40, and the like, as shown in FIG. 1.

Referring back to FIG. 1, the board 40 is used as an example of a board which supports the power semiconductor device 10 and is electrically connected to the power semiconductor device 10. The board 40 according to the first embodiment includes an insulating layer 41 and a conductive wiring pattern 42. In the board 40, the wiring pattern 42 is formed on the insulating layer 41. The insulating layer 41 is a plate-like insulating layer which is arranged on an inner bottom surface of the case 50 and is made of an insulative material, such as resin or ceramic. The board 40 is arranged inside the case 50 such that the insulating layer 41 is in contact with the inner bottom surface of the case 50. The wiring pattern 42 may be made of a conductor, such as copper or nickel, or may be formed by plating copper with a metal, such as nickel or gold. The board-side electrode 11b is on and in contact with the wiring pattern 42, thereby electrically connecting the board 40 and the power semiconductor device 10. Although FIG. 1 shows a case where the board-side electrode 11b and the wiring pattern 42 are joined together, the present disclosure is not limited to this case. For example, the board-side electrode 11b and the wiring pattern 42 may maintain contact therebetween by pressure or may maintain contact with a conductive buffer sandwiched therebetween (see FIG. 13), as will be described later. Although not shown in FIG. 1, a resist made of an insulator for fixing the position of the power semiconductor device 10 may be arranged on the wiring pattern 42. Note that the board 40 is a circuit board which is patterned for constituting an electric circuit and has a conductor to connect to a component which joins together and is integral with insulation or a structure with a conductor (lead frame) alone. In the first embodiment, a circuit board in which a conductor and insulation join together to be integral with each other is used as the board 40.

The case 50 is a member which houses the power semiconductor device 10, the conductor-side electrode 11a, the board-side electrode 11b, the conductor 20, the insulator 30, and the board 40 described above. The members are arranged such that the conductor 20 (the fourth conductor section 24) is in contact with the inner upper surface of the case 50, the board 40 is in contact with the inner bottom surface of the case 50, and the insulator 30 is in contact with an inner side surface of the case 50. The case 50 according to the first embodiment is made of a material which is insulative, is less thermally expansive, and has high strength (for example, ceramic or resin). As will be described later, a force due to expansion of the insulator 30 and the conductor 20 is applied from within to the case 50, and a material having enough strength to withstand the force is used as the material for the case 50.

An opening for permitting the fifth conductor section 25 of the conductor 20 to pass through is formed in an upper surface of the case 50. Although FIG. 1 illustrates a case where the fifth conductor section 25 is made to pass upward through the upper surface of the case 50, the present disclosure is not limited to this case. The case 50 may have an opening for permitting the fifth conductor section 25 to pass through the side surface of the case 50 in the lateral direction.

The heat sink 60 is a plate for dissipating heat inside the case 50 to the outside through the case 50. As shown in FIG. 1, the heat sink 60 is attached to the lower side of the case 50 where the power semiconductor device 10 and the electrodes as a main heat source are located. Note that although the heat sink 60 that is composed of a plurality of plates is used in the first embodiment, as shown in FIG. 1, the present disclosure is not limited to this case. For example, a heat radiator, such as an air cooler or a water cooler, may be used. An inside of the case 50 may be water-cooled by passing a pipe into the case 50 and feeding water through the pipe, instead of using the heat sink 60. Alternatively, the heat sink 60 or a cooling mechanism that is integral with the case 50 may be used.

The action of the electronic device 1 with the above-described configuration during operation will be described below.

When the electronic device 1 shown in FIG. 1 operates, a current flows mainly through the power semiconductor device 10 and the conductor 20. The temperatures of the members rise, which leads to an overall rise in the temperature inside the electronic device 1 (from 25° C. to 125° C., for example). The rise in the temperature inside the electronic device 1 causes members, such as the insulator 30 and the conductor 20, to expand. The relationship between stresses at the members at the time of the expansion is shown in FIG. 3.

Figure 3:
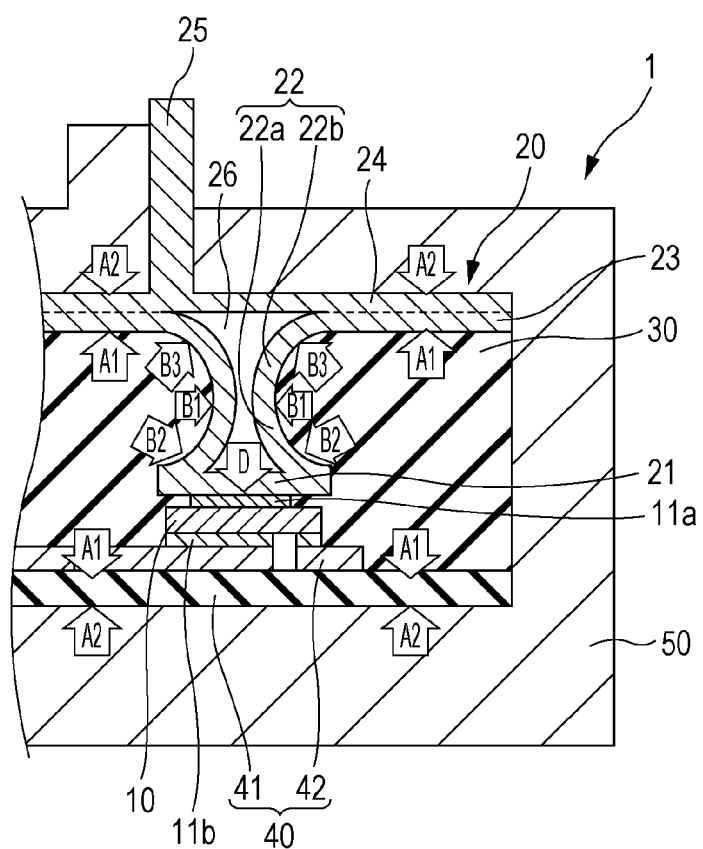
FIG. 3 is a cross-sectional view showing stresses acting on the electronic device according to the first embodiment.

As shown in FIG. 3, the inner upper surface and the inner bottom surface of the case 50 are subjected to stresses from the expanded insulator 30 (an arrow A1). In response to the stresses, reaction forces from the case 50 act on the conductor 20 and the board 40 (an arrow A2). Even if such stresses and reaction forces occur, the case 50 is made of a rigid body, and the insulator 30 that is located close to the case 50 is unlikely to be deformed.

In other words, the conductor 20 is subjected to a stress due to expansion from the insulator 30, and the case 50 is subjected to the stress from the insulator 30 via the conductor 20. The case 50 is a rigid body and is unlikely to be broken or deformed due to a stress. A reaction force from the case 50 acts on the conductor 20 and then acts on the insulator 30 via the conductor 20. The conductor 20 is displaced to a position where a balance between the stress and the reaction force is achieved. Since the insulator 30 having elasticity contracts due to the reaction force, the insulator 30 is less deformed, and the balance between the forces is maintained.

At a spot where the insulator 30 and the second conductor section 22 are in contact with each other, a stress is applied from the insulator 30 to the second conductor section 22. More specifically, a stress in a substantially horizontal direction acts on a central portion in the vertical direction of the second conductor section 22 (an arrow B1). An obliquely downward stress and an obliquely upward stress act on the lower inclined surface 22a and the upper inclined surface 22b, respectively, in the second conductor section 22 (arrows B2 and B3). A region between the two second conductor sections 22 facing each other has the hollow space 26 formed therein, which allows the second conductor section 22 to be easily deformed. With the above-described configuration, an obliquely downward stress (the arrow B2) from the insulator 30 on the lower inclined surface 22a among stresses on the second conductor section 22 transforms into a force pressing the conductor 20 toward the conductor-side electrode 11a (an arrow D).

As described above, in the electronic device 1 according to the first embodiment, the second conductor section 22 of the conductor 20 includes the inclined surface 22a that is inclined in a direction toward the central axis H passing through the center of the electrode (the conductor-side electrode 11a) and perpendicular to the surface of the electrode. The insulator 30 that encloses the conductor 20 and the electrode is in contact with the second conductor section 22 from the side opposite to the central axis H passing through the center of the electrode. With the above-described configuration, if the insulator 30 expands when the temperature inside the electronic device 1 becomes high during operation of the electronic device 1, a force in a direction toward the electrode is applied from the insulator 30 to the second conductor section 22. This increases the strength of contact between the conductor 20 and the electrode. Since the condition of contact of the conductor 20 with the electrode can be maintained regardless of the temperature of the electronic device 1, the reliability of the electronic device 1 can be enhanced.

In the electronic device 1 according to the first embodiment, the second conductor sections 22 are formed such that portions extending from the two facing edges of the first conductor section 21 each have an inclined surface, and a space where the insulator 30 is not arranged (the hollow space 26) is formed between the second conductor sections 22. According to the above-described configuration, the insulator 30 is not arranged between the second conductor sections 22. This allows securement of a space which permits the second conductor section 22 pushed by the expanded insulator 30 to be deformed when the temperature inside the electronic device 1 is high. It is thus possible to increase the strength of contact of the conductor 20 with the electrode and enhance the reliability of the electronic device 1.

The electronic device 1 according to the first embodiment includes the board 40 that is electrically connected to the component (the power semiconductor device 10) and supports the component. The conductor 20 includes the third conductor section 23 that is connected to the end on the side opposite to the connection with the first conductor section 21 of the second conductor section 22 to extend in a direction away from the central axis H of the electrode and is arranged so as to face the board 40. The insulator 30 is arranged between the board 40 and the third conductor section 23. According to the above-described configuration, the board 40 and the third conductor section 23 are arranged so as to sandwich the insulator 30. When the temperature inside the electronic device 1 becomes high during operation of the electronic device 1, a force can be more reliably applied from the insulator 30 to the second conductor section 22. A stress from the insulator 30 due to expansion acts on the board 40, and the board 40 comes into close contact with the case 50, which improves heat dissipation. Similarly, the stress brings the third conductor section 23 and the fourth conductor section 24 into close contact, which enhances the reliability of the electronic device 1. Lateral expansion of the insulator 30 causes a stress to be applied from the insulator 30 to the second conductor section 22.

In the electronic device 1 according to the first embodiment, the coefficient of thermal expansion of the insulator 30 is higher than that of the conductor 20. For this reason, the dimensions of the insulator 30 are larger than those of the second conductor section 22 after expansion when the temperature inside the electronic device 1 is high. A stress from the insulator 30 acts on the second conductor section 22 to increase the strength of contact of the conductor 20 with the electrode, which allows enhancement of the reliability of the electronic device 1.

In the electronic device 1 according to the first embodiment, the electrode is in contact with the first conductor section 21 at the whole of the surface facing the first conductor section 21 in the electrode. This configuration allows increase in the strength of contact of the conductor 20 with the electrode and enhancement of the reliability of the electronic device 1. The configuration also allows increase in heat dissipation and current capacity. Note that the present disclosure is not limited to a case as in the first embodiment where the electrode (the conductor-side electrode 11a) is in contact with the first conductor section 21 at the whole of the surface in contact with the first conductor section 21 in the electrode and that the percentage by area of a portion in contact with the first conductor section 21 to the surface facing the first conductor section 21 of the electrode may be not less than 50%. Even in this case, it is possible to increase the strength of contact of the conductor 20 with the electrode and enhance the reliability of the electronic device 1. If the surface areas of surfaces in contact with each other of the electrode and the first conductor section 21 are equal in this case, the strength of contact of the conductor 20 with the electrode can be further increased. A large contact area increases the current capacity and brings about the effect of providing a reliable electrical connection.

The action of the electronic device 1 during operation has been described above. The coefficients of thermal expansion and the dimensions, such as a thickness, a width, and a length, of the insulator 30 and the conductor 20 may be set to be not more than safety values at which the insulator 30 and the conductor 20 do not break when a stress from the insulator 30 acts on the conductor 20.

As for the dimensions of the conductor 20, minimum dimensions depend on the values of a voltage and a current applied to the conductor-side electrode 11a. The minimum necessary cross-sectional area of the conductor 20 is calculated from the maximum rated current of the electronic device 1, a maximum value for a surge current, and the like. Note that the thickness of the conductor 20 may be set to an appropriate thickness in view of a difference in coefficient of thermal expansion between the conductor 20 and the insulator 30 and a Young's modulus.

Note that, in order to apply a stress in a direction toward the conductor-side electrode 11a from the insulator 30 to the second conductor section 22, it suffices that the insulator 30 has a portion in close contact with the inclined surface 22a that is inclined in a direction toward the central axis H of the electrode of the inclined surface of the second conductor section 22. By adjusting the inclined area or the angle of inclination of the inclined surface 22a, the thickness of the insulator 30, or the like such that a force acts on surfaces in close contact in a direction toward the conductor-side electrode 11a, the strength of contact of the insulator 30 with the second conductor section 22 can be enhanced.

At the time of selection of the material for the insulator 30, a material which is somewhat low in Young's modulus and the like and, in particular, compressive strength in addition to coefficient of thermal expansion may be selected. Due to the difference in coefficient of thermal expansion, the insulator 30 expands more than the conductor 20. A material within a range which allows compression of the insulator 30, notably a material with values not more than safety values at which the insulator 30 does not degrade or break after long hours of pressurization, may be selected as the material for the insulator 30. With this selection, it is possible to inhibit the insulator 30 from being deformed due to excess over a compressed limit caused by expansion-induced heavy pressure of the insulator 30 and inhibit an excessive force from being applied to the conductor 20. It is also possible to inhibit the power semiconductor device 10 from breaking due to an excessive pushing force from the first conductor section 21.

By way of example, if the conductor-side electrode 11a is 10 mm square, the conductor 20 may be formed from a copper plate having a thickness of 0.5 mm and a width of 12 mm. The first conductor section 21 may be formed to be 12 mm square using such a copper plate.

The coefficient of thermal expansion of the insulator 30 may be higher than the coefficient of thermal expansion of 16E-6 of copper that is the material for the conductor 20.

The coefficients of thermal expansion of most resins are not less than 16E-6. Epoxy resin or a high-voltage resistant rubber sheet that is widely used in electronic equipment or silicone rubber that has a coefficient of thermal expansion 10 times that of copper and is easily expandable may be used as the material for the insulator 30.

Figure 4A:
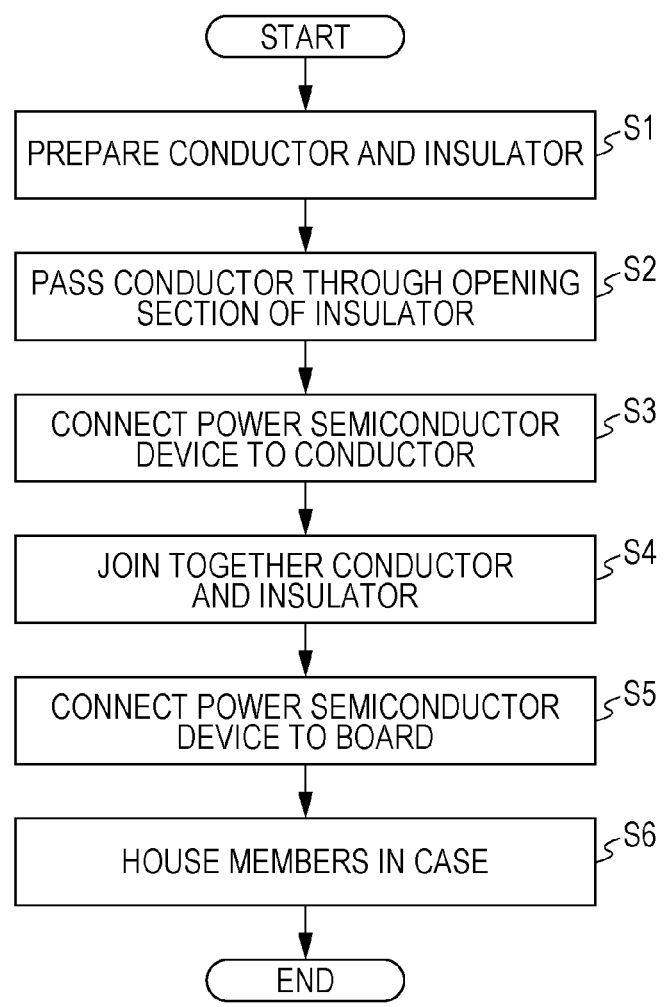
FIG. 4A is a flowchart of a first method for manufacturing the electronic device according to the first embodiment.

Methods for manufacturing the electronic device 1 described above will be described with reference to FIGS. 4A to 4D and 5A to 5D. FIGS. 4A and 5A show flowcharts, respectively, of the methods for manufacturing the electronic device 1. FIGS. 4B to 4D and 5B to 5D show cross-sectional views for explaining the manufacturing methods to be implemented in accordance with the flowcharts in FIGS. 4A and 5A.

(First Manufacturing Method)

Figure 4B:
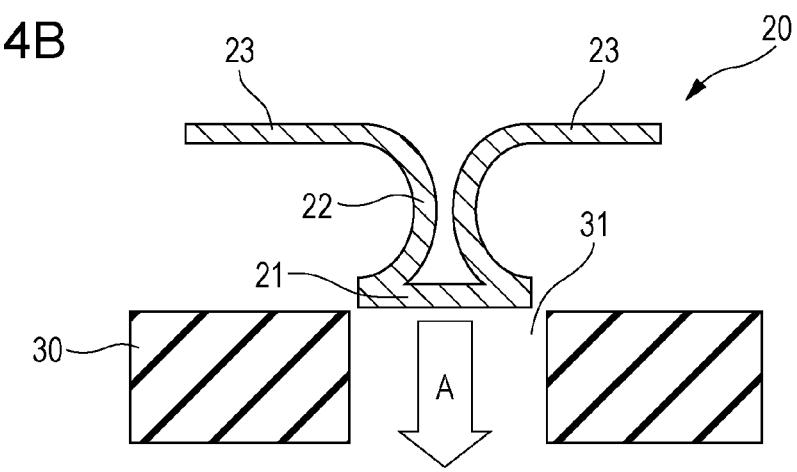
FIG. 4B is a view showing the first method for manufacturing the electronic device according to the first embodiment.
Figure 5A:
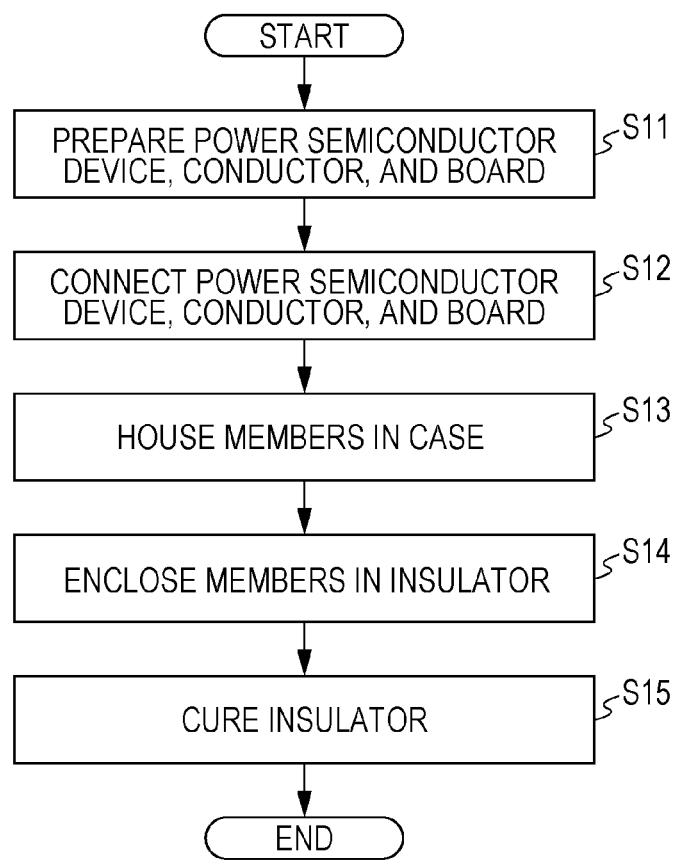
FIG. 5A is a flowchart of a second method for manufacturing the electronic device according to the first embodiment.

As shown in FIG. 4B, the conductor 20 and the insulator 30 are first prepared (step S1). More specifically, of the conductor 20 shown in FIG. 1, the first conductor section 21, the second conductor section 22, and the third conductor section 23 are prepared as the conductor 20. As the insulator 30, the insulator 30 that has the opening section 31 for permitting the conductor 20 to pass through and is shape-changeable is prepared. In the first manufacturing method, a copper plate is used as the material for the conductor 20, and the conductor 20 is formed by cutting the copper plate in a desired shape and performing processing, such as bending. Plate-like insulating rubber is used as the material for the insulator 30, and the opening section 31 is formed.

Figure 4C:
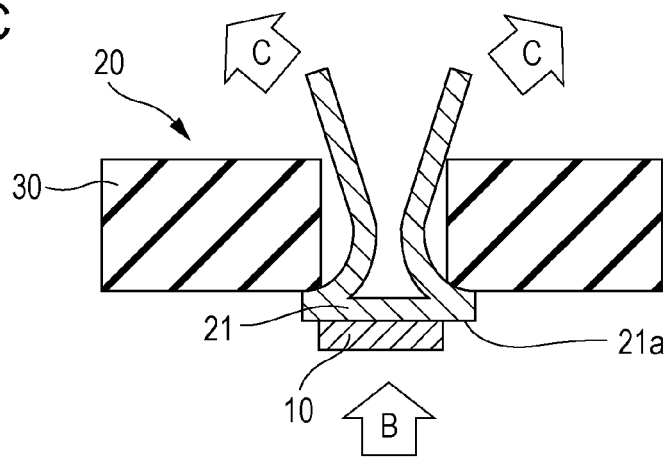
FIG. 4C is a view showing the first method for manufacturing the electronic device according to the first embodiment.

The conductor 20 is passed through the opening section 31 of the insulator 30 (step S2). More specifically, as shown in FIG. 4B, the conductor 20 is integrally moved downward toward the opening section 31 of the insulator 30 (an arrow A). After that, as shown in FIG. 4C, the conductor 20 is stopped after the first conductor section 21 of the conductor 20 passes through the opening section 31. Note that since the insulator 30 is made of a material which has elasticity and is shape-changeable, even if the first conductor section 21 is larger than an opening size of the insulator 30, the first conductor section 21 can be passed through the opening section 31.

The power semiconductor device 10 is connected to the conductor 20 (step S3). More specifically, as shown in FIG. 4C, the conductor 20 is electrically connected to the power semiconductor device 10 by bringing the surface of the conductor-side electrode 11a (not shown) of the power semiconductor device 10 into close contact with the lower surface (the electrode contact surface 21a) of the first conductor section 21 of the conductor 20 (an arrow B).

Figure 4D:
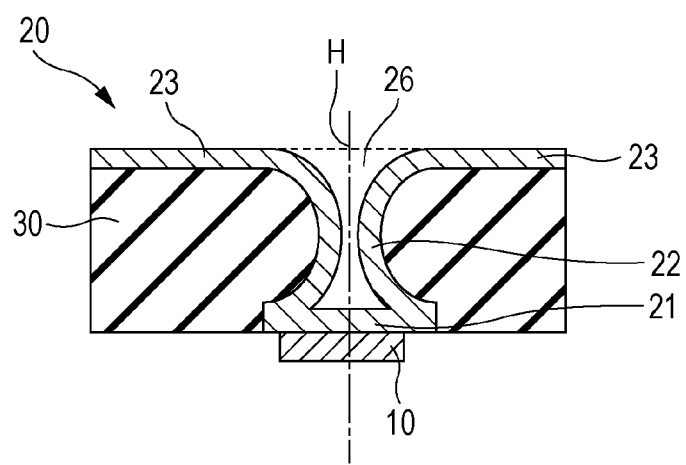
FIG. 4D is a view showing the first method for manufacturing the electronic device according to the first embodiment.

The conductor 20 and the insulator 30 are joined together (step S4). More specifically, as shown in FIG. 4C, the conductor 20 and the power semiconductor device 10 are pulled back into the opening section 31 while the third conductor section 23 is spread in the lateral direction such that the second conductor section 22 of the conductor 20 fits the insulator 30 (an arrow C). Since a shape-changeable substance is used as the material for the insulator 30, the insulator 30 also changes in shape so as to fit the shape of the second conductor section 22 with the spread of the second conductor section 22 and the third conductor section 23. That is, when the insulator 30 changes in shape, the conductor 20 also arranges its shape, thereby forming inclined surfaces (22a and 22b). Finally, as shown in FIG. 4D, the second conductor section 22 and the third conductor section 23 of the conductor 20 are kept in close contact with the insulator 30.

The power semiconductor device 10 is then connected to the board 40 (step S5). More specifically, the power semiconductor device 10 is electrically connected by pushing the board 40 toward the opening section 31 such that the board 40 is in contact with the board-side electrode 11b (not shown) on the lower side of the power semiconductor device 10 and bringing the wiring pattern 42 into close contact with the board-side electrode 11b (see FIG. 1). Alternatively, after the board 40 may be brought into contact with the board-side electrode 11b when the power semiconductor device 10 is brought into contact with the first conductor section 21, the conductor 20 may be pushed back into the opening section 31 while the power semiconductor device 10 is sandwiched between the conductor 20 and the board 40. Note that the step subsequent to step S5 is performed so as to manufacture the same electronic device 1 as in FIG. 1 and is not illustrated.

The members are housed in the case 50 (step S6). More specifically, the power semiconductor device 10, the electrodes, the conductor 20, and the insulator 30 described above are placed in the case 50, the fifth conductor section 25 of the conductor 20 is made to pass through the opening in the upper surface of the case 50 to the outside, and the case 50 is sealed. At this time, after the constituent members inside the case 50 are assembled while the third conductor section 23 and the fourth conductor section 24 are brought into contact with each other, the constituent members are collectively placed in the case 50.

As described above, by performing steps S1 to S6, the electronic device 1 shown in FIG. 1 can be manufactured.

(Second Manufacturing Method)

A method for manufacturing the electronic device 1 which is different from the manufacturing method in FIGS. 4A to 4D will be described with reference to FIGS. 5A to 5D. In the second manufacturing method, a copper plate is used as the material for the conductor 20, and thermosetting liquid resin is used as the material for the insulator 30.

Figure 5B:
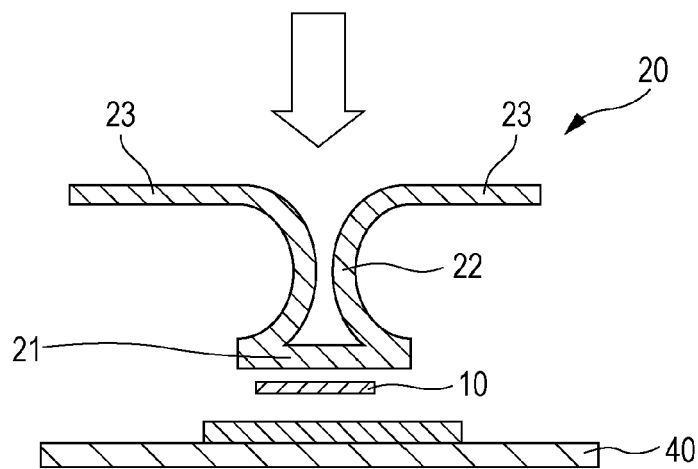
FIG. 5B is a view showing the second method for manufacturing the electronic device according to the first embodiment.

As shown in FIG. 5B, the power semiconductor device 10, the conductor 20, and the board 40 are first prepared (step S11). More specifically, the power semiconductor device 10, the conductor 20 (the first conductor section 21, the second conductor section 22, and the third conductor section 23), and the board 40 that are the same as those shown in FIG. 1 are prepared, and the members are arranged in the order of the conductor 20, the power semiconductor device 10, and the board 40 from the top, as shown in FIG. 5B.

Figure 5C:
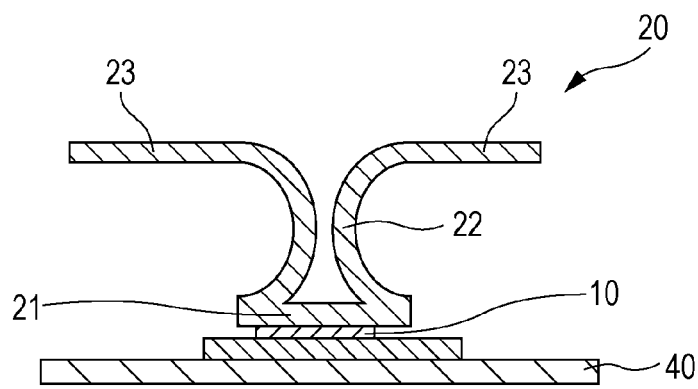
FIG. 5C is a view showing the second method for manufacturing the electronic device according to the first embodiment.

The conductor 20, the power semiconductor device 10, and the board 40 are then connected (step S12). More specifically, as shown in FIG. 5C, the conductor 20, the power semiconductor device 10, and the board 40 are electrically connected to each other by laying the board 40, the power semiconductor device 10, and the conductor 20 in this order to bring the members into contact with each other and bringing the members in this state into close contact.

The members are then housed in the case 50 (step S13). More specifically, the conductor 20, the power semiconductor device 10, and the board 40 brought into close contact in step S12 are housed in the case 50 shown in FIG. 1 (the case 50 is not shown in FIG. 5C).

Figure 5D:
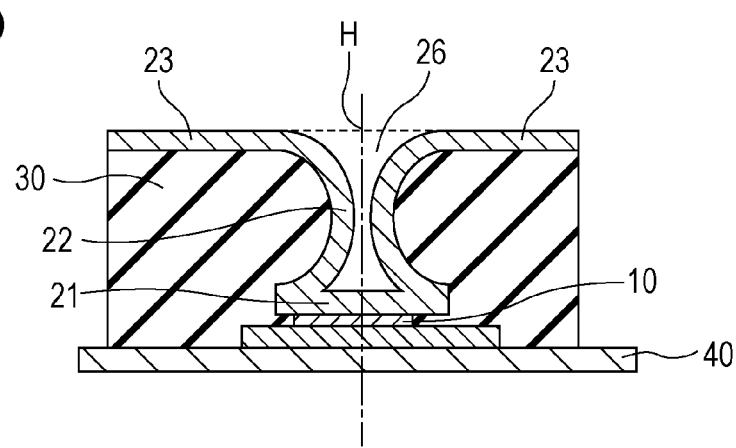
FIG. 5D is a view showing the second method for manufacturing the electronic device according to the first embodiment.

Enclosure in the insulator 30 is performed (step S14). More specifically, as shown in FIG. 5D, the insulator 30 is arranged between the third conductor section 23 of the conductor 20 and the board 40 to enclose the power semiconductor device 10 and the like while the members are housed in the case 50 (not shown).

In the second manufacturing method, the liquid thermosetting resin is used as the material for the insulator 30. As shown in FIG. 5D, the insulator 30 is cured by heating the insulator 30 with the power semiconductor device 10 and the like enclosed therein (step S15).

Note that the second manufacturing method has been described in the context of a case where the liquid thermosetting resin is used as the material for the insulator 30 and is cured through heating. The present disclosure, however, is not limited to this case, and enclosure in the insulator 30 may be performed by any other method. For example, the insulator 30 may be cured through ultraviolet irradiation, use of a curing agent, or the like, besides heating. If metallic molding, compression molding, or the like is performed, the insulator 30 need not be finally cured. Additionally, enclosure in the insulator 30 may be performed by a molding method using thermoplastic resin or a molding method, such as potting or dropping. The method for enclosure in the insulator 30 may be an arbitrary method, and processes or the order of processes may be changed for efficient manufacture depending on how to handle the insulator 30. Although the insulator 30 is charged so as to come into close contact with the second conductor section 22 and the third conductor section 23 in the example shown in FIG. 5D, the present disclosure is not limited to this case. A space may be formed in the insulator 30 or a gap may be formed between the insulator 30 and a different member.

As described above, by performing steps S11 to S15, the electronic device 1 shown in FIG. 1 can be manufactured.

Note that, in each of the first and second manufacturing methods, the board 40, the conductor 20, and the power semiconductor device 10 are housed in the case 50 and that the shape-changeable insulator 30 is arranged while the members are in press-contact with each other.

As described above, the first and second manufacturing methods shown in FIGS. 4A to 4D and 5A to 5D both include a process of bringing the first conductor section 21 of the conductor 20 into contact with an electrode (the conductor-side electrode 11a) placed on a component (the power semiconductor device 10) along the surface of the electrode (steps S3 and S12), a process of forming the inclined surface 22a that is inclined in a direction toward the central axis H passing through the center of the electrode and perpendicular to the surface of the electrode at the second conductor section 22 connected to the corresponding edge of the first conductor section 21 and extending in a direction away from the electrode (steps S4 and S11), and a process of enclosing the conductor 20 and the electrode while bringing the insulator 30 into contact with the second conductor section 22 from the side opposite to the central axis H of the electrode (steps S4 and S14). In the electronic device 1 manufactured in the above-described manner, the second conductor section 22 of the conductor 20 includes the inclined surface 22a that is inclined in the direction toward the central axis H of the electrode, as described above. Since the condition of contact of the conductor 20 with the electrode can be maintained regardless of the temperature of the electronic device 1, the reliability of the electronic device 1 can be enhanced.

Note that the order of the steps may be changed in each of the manufacturing methods shown in FIGS. 4B to 4D and 5B to 5D as long as the same electronic device 1 can be manufactured. For example, in the first manufacturing method, steps S3 and S4 may be interchanged. In order not to arrange the insulator 30 between the facing second conductor sections 22 (in order to form the hollow space 26), a process may be added or any process may be changed. Alternatively, a solid or a liquid may be used as the material for the insulator 30.

Note that the same electronic device 1 may be manufactured using a method other than the manufacturing methods shown in FIGS. 4B to 4D and 5B to 5D. Although a case where the manufacturing methods are used for one power semiconductor device 10 alone have been described with reference to FIGS. 4B to 4D and 5B to 5D, the present disclosure is not limited to this case. The same manufacturing methods may be used simultaneously for a plurality of power semiconductor devices 10.

Figure 6:
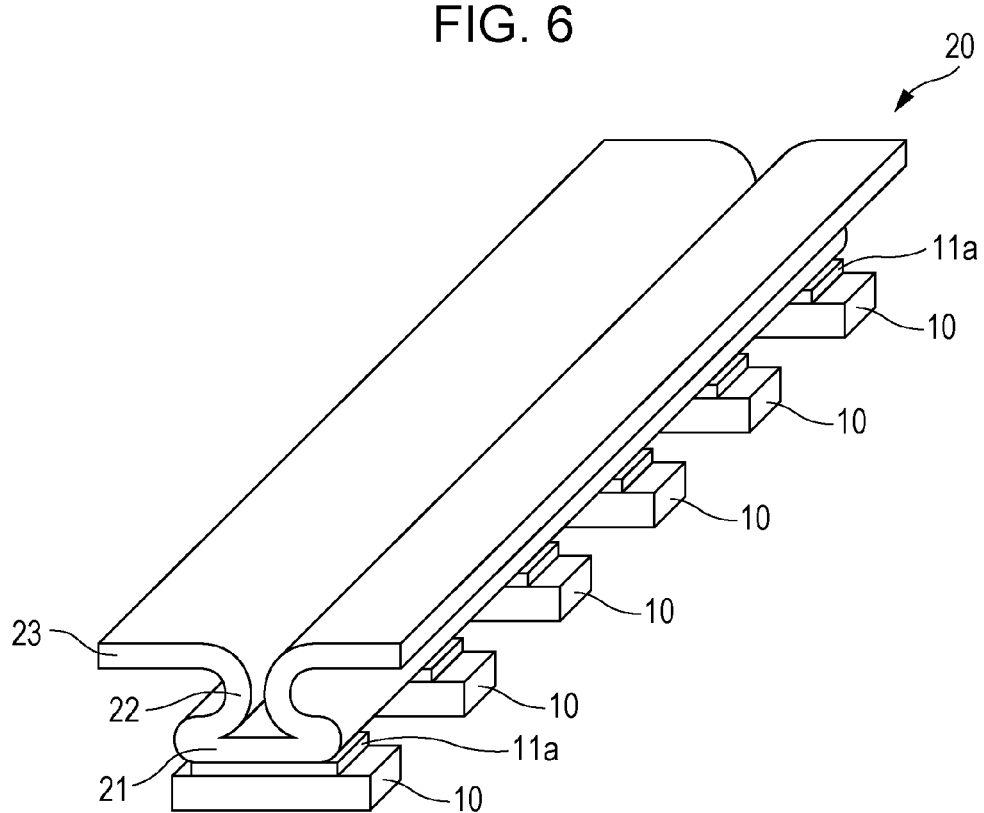
FIG. 6 is a perspective view showing an example of a conductor connectable to a plurality of components.

For example, the conductor 20 can be simultaneously connected to a plurality of power semiconductor devices 10 through use of the conductor 20 having the same cross-sectional shape as that of the conductor 20 shown in FIG. 1 and extending long in a direction perpendicular to a cross-section, as shown in FIG. 6. In the conductor 20 shown in FIG. 6, the first conductor section 21 extends along a direction in which the plurality of power semiconductor devices 10 are arrayed so as to connect to the power semiconductor devices 10.

First to seventh modifications of the electronic device 1 according to the first embodiment will be described below.

Figure 10:
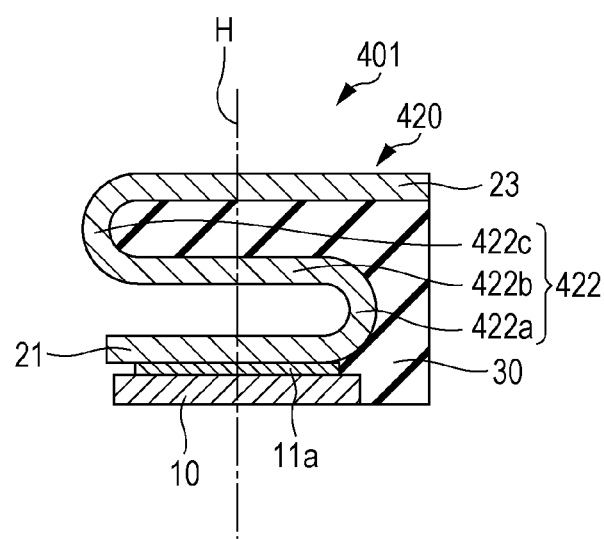
FIG. 10 is a cross-sectional view of an electronic device according to a fourth modification of the first embodiment.
Figure 11:
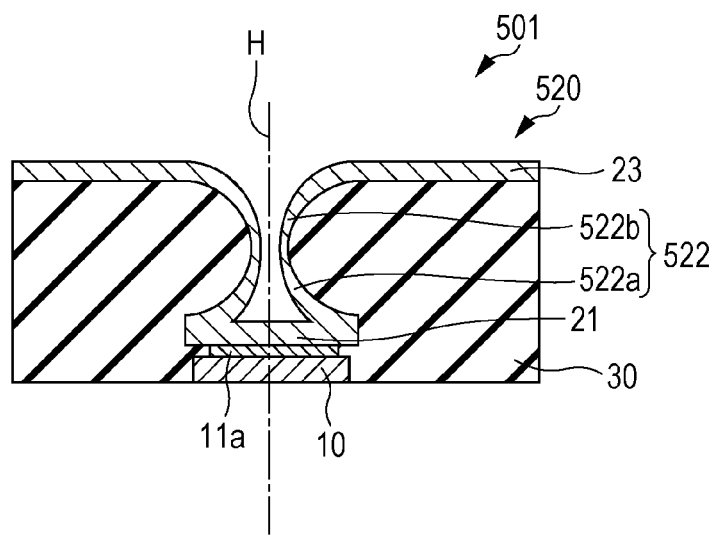
FIG. 11 is a cross-sectional view of an electronic device according to a fifth modification of the first embodiment.
Figure 12:
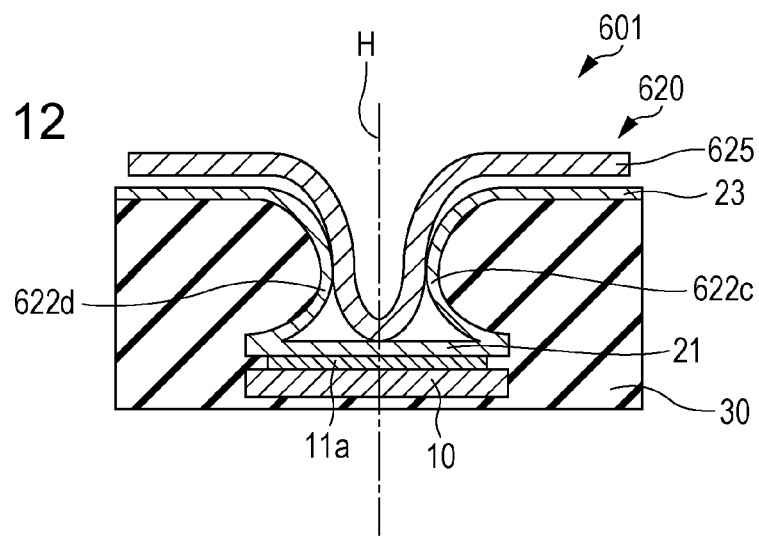
FIG. 12 is a cross-sectional view of an electronic device according to a sixth modification of the first embodiment.
Figure 13:
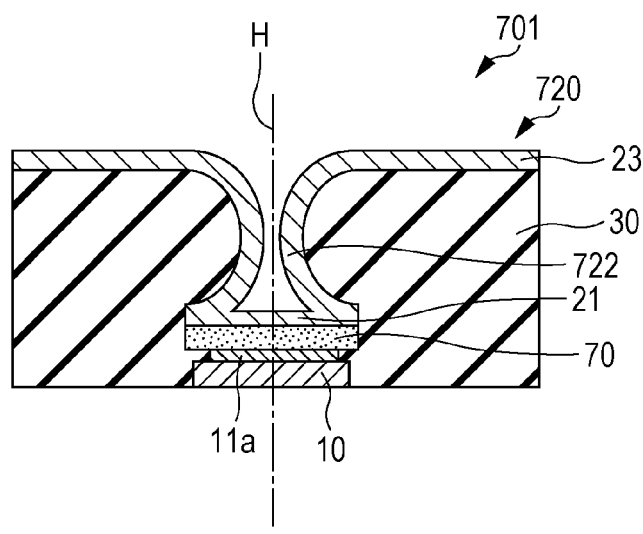
FIG. 13 is a cross-sectional view of an electronic device according to a seventh modification of the first embodiment.

FIGS. 7 to 13 show electronic devices 101, 201, 301, 401, 501, 601, and 701, respectively, according to the first to seventh modifications of the first embodiment. The first to fifth modifications shown in FIGS. 7 to 11 are different from the first embodiment mainly in the shape(s) of a conductor (and the insulator 30). The sixth modification shown in FIG. 12 is different from the first embodiment in that an auxiliary conductor 625 is provided in addition to a conductor 620. The seventh modification shown in FIG. 13 is different from the first embodiment in that a conductive buffer 70 is provided between the conductor-side electrode 11a and the first conductor section 21. The remaining part of each modification is the same as that of the first embodiment, and a description thereof will be omitted.

(First Modification)

Figure 7:
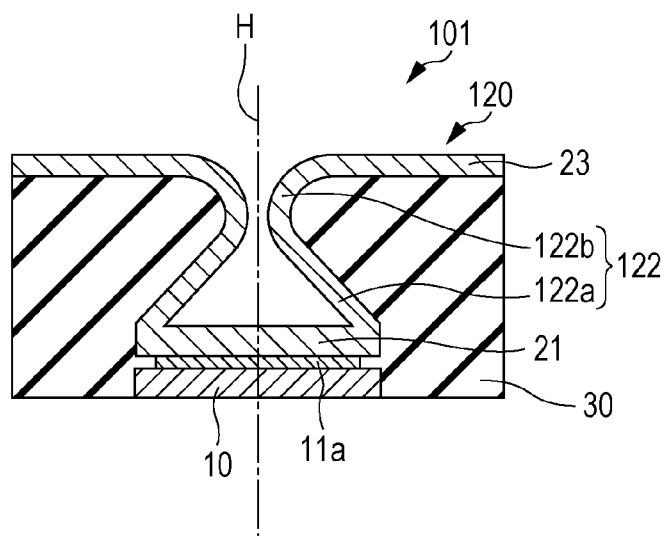
FIG. 7 is a cross-sectional view of an electronic device according to a first modification of the first embodiment.

In the electronic device 101 shown in FIG. 7, a second conductor section 122 of a conductor 120 includes a flat section 122a and a curved section 122b. The flat sections 122a extend flatly upward from right and left edges of the first conductor section 21 and constitute inclined surfaces which are inclined in directions toward the central axis H. The curved section 122b extends curvedly from an upper end of the flat section 122a to the third conductor section 23. Since the cross-sectional length of the flat section 122a is large in the electronic device 101, a stress from the insulator 30 acting on the flat section 122a in a direction toward the conductor-side electrode 11a is high. This allows further enhancement of the reliability of the electronic device 101 during operation.

(Second Modification)

Figure 8:
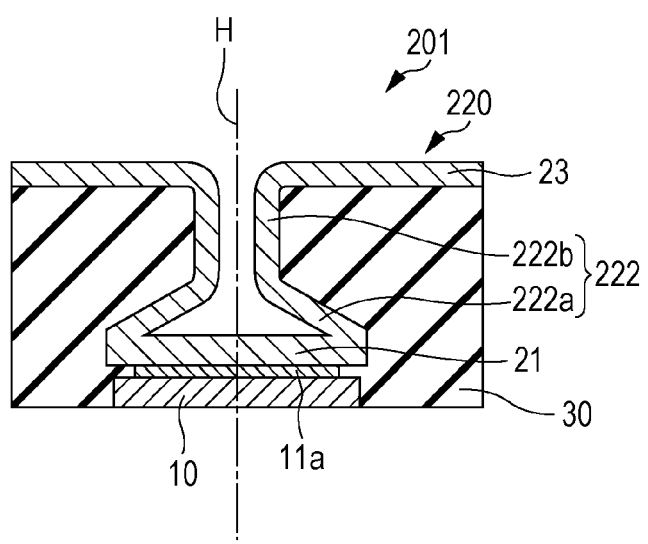
FIG. 8 is a cross-sectional view of an electronic device according to a second modification of the first embodiment.

In the electronic device 201 shown in FIG. 8, a second conductor section 222 of a conductor 220 includes a first flat section 222a and a second flat section 222b. The first flat sections 222a extend flatly upward from right and left edges of the first conductor section 21 and constitute inclined surfaces which are inclined in directions toward the central axis H. The second flat section 222b extends flatly in a perpendicular direction from an upper end of the first flat section 222a to the third conductor section 23. As described above, since the second conductor section 222 is composed of two flat sections in the electronic device 201 according to the second modification, the electronic device 201 can be more easily manufactured. That is, since a stress due to vertical expansion of the insulator 30 acts not on the second flat section 222b but on the first flat section 222a alone, the reliability during operation can be further enhanced.

(Third Modification)

Figure 9:
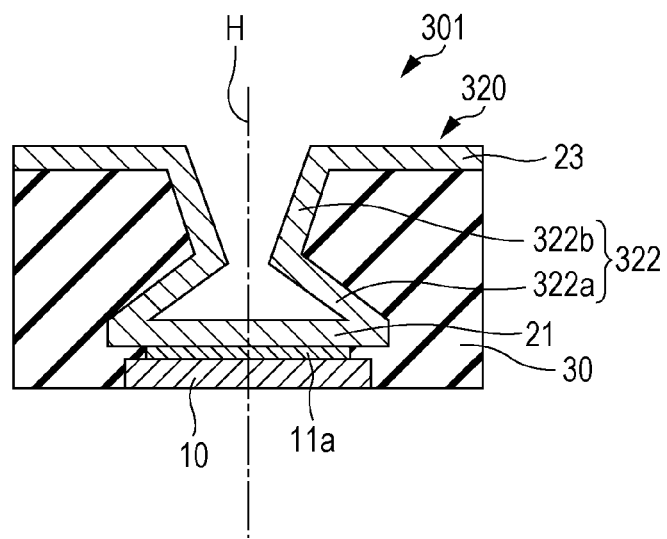
FIG. 9 is a cross-sectional view of an electronic device according to a third modification of the first embodiment.

In the electronic device 301 shown in FIG. 9, a second conductor section 322 of a conductor 320 includes a first flat section 322a and a second flat section 322b. The first flat sections 322a extend flatly upward from right and left edges of the first conductor section 21 and constitute inclined surfaces which are inclined in directions toward the central axis H. The second flat section 322b extends flatly from an upper end of the first flat section 322a to the third conductor section 23 and constitutes an inclined surface which is inclined in a direction away from the central axis H. Like the second modification, the second conductor section 322 is composed of two flat sections in the electronic device 301 according to the third modification. This allows easier manufacture of the electronic device 301.

(Fourth Modification)

In the electronic device 401 shown in FIG. 10, a conductor 420 has a substantially S-shape. More specifically, a second conductor section 422 of the conductor 420 includes a first curved section 422a, a flat section 422b, and a second curved section 422c. The first curved section 422a extends curvedly upward from an edge of the first conductor section 21 and has an inclined surface which is inclined in a direction away from the central axis H and an inclined surface which is inclined in a direction toward the central axis H. The flat section 422b extends in parallel to the first conductor section 21 from an end of the first curved section 422a. The second curved section 422c extends curvedly upward from an end of the flat section 422b to the third conductor section 23. With the above-described configuration, even if the second conductor section 22 is not arranged symmetrically with respect to the central axis H, as in the first embodiment and the other modifications, a stress applied from the conductor 420 to the conductor-side electrode 11a can be increased in a high-temperature environment during component operation. Since the conductor 420 can be formed from one plate, the number of man-hours needed to process the conductor 420 and joints between conductors in the conductor 420 can be reduced.

(Fifth Modification)

In the electronic device 501 shown in FIG. 11, a conductor 520 has almost the same shape as that of the conductor 20 according to the first embodiment and is different only in thickness in a width direction. More specifically, the thickness in the width direction of the conductor 20 is even in the first embodiment while the thickness in the width direction of the conductor 520 is uneven in the fifth modification. More specifically, the thickness of the second conductor section 522 is set to be smaller than those of the first conductor section 21 and the third conductor section 23. As described above, in the electronic device 501 according to the fifth modification, the thickness of the second conductor section 522 that is deformed at the time of expansion is smaller than that of the first conductor section 21 in contact with the conductor-side electrode 11a. It is thus possible to make the second conductor section 522 more deformable while securing the strength of contact at the first conductor section 21.

(Sixth Modification)

As shown in FIG. 12, the electronic device 601 according to the sixth modification includes the auxiliary conductor 625 in addition to a conductor 620. The auxiliary conductor 625 extends so as to be in contact with the first conductor section 21 between facing second conductor sections 622c and 622d of the conductor 620. More specifically, the auxiliary conductor 625 curves so as to protrude downward in contact with central portions of inner side walls of the second conductor sections 622c and 622d and is in contact with the first conductor section 21 at a turning point of a curve. With the above-described configuration, the auxiliary conductor 625 is in contact with a central portion between two edges, to which the second conductor sections 622c and 622d are connected, in the first conductor section 21 of the conductor 620. As described above, the provision of the auxiliary conductor 625 in addition to the conductor 620 allows increase of the current capacity in the electronic device 601. Additionally, in the electronic device 601 according to the sixth modification, the thickness of the auxiliary conductor 625 is set to be larger than that of the conductor 620. This allows further increase in the current capacity of the auxiliary conductor 625 that is intended mainly to increase current.

(Seventh Modification)

The electronic device 701 shown in FIG. 13 includes the conductive buffer 70 between the conductor-side electrode 11a and the first conductor section 21 of a conductor 720. The conductive buffer 70 is made of a material having conductivity and elasticity, such as conductive silicone rubber or a metallic sponge-like cushion. Through the use of the conductive buffer 70, it is possible to enhance close contact between the conductor-side electrode 11a and the first conductor section 21 while securing electrical connection between the conductor-side electrode 11a and the first conductor section 21 and relieve excessive pressure at the time of pressure contact. This allows enhancement of the reliability of the electronic device 701.

As shown in FIGS. 7 to 13, the second conductor sections 122 to 722 of the conductors 120 to 720 in the electronic devices 101 to 701 according to the first to seventh modifications each include an inclined surface which is inclined in a direction toward the central axis H of the electrode (the conductor-side electrode 11a). The insulator 30 that encloses one of the conductors 120 to 720 and the corresponding electrode is in contact with a corresponding one of the second conductor sections 122 to 722 from the side opposite to the central axis H of the electrode. With the above-described configuration, if the insulator 30 expands when the temperature inside a corresponding one of the electronic devices 101 to 701 becomes high during operation, a force in a direction toward the corresponding electrode is applied from the insulator 30 to a corresponding one of the second conductor sections 122 to 722. This increases the strength of contact of one of the conductors 120 to 720 with the corresponding electrode. Since the condition of contact of one of the conductors 120 to 720 with the corresponding electrode can be maintained regardless of the temperature of a corresponding one of the electronic devices 101 to 701, the reliability of the one of the electronic devices 101 to 701 can be enhanced.

(Second Embodiment)

Figure 14:
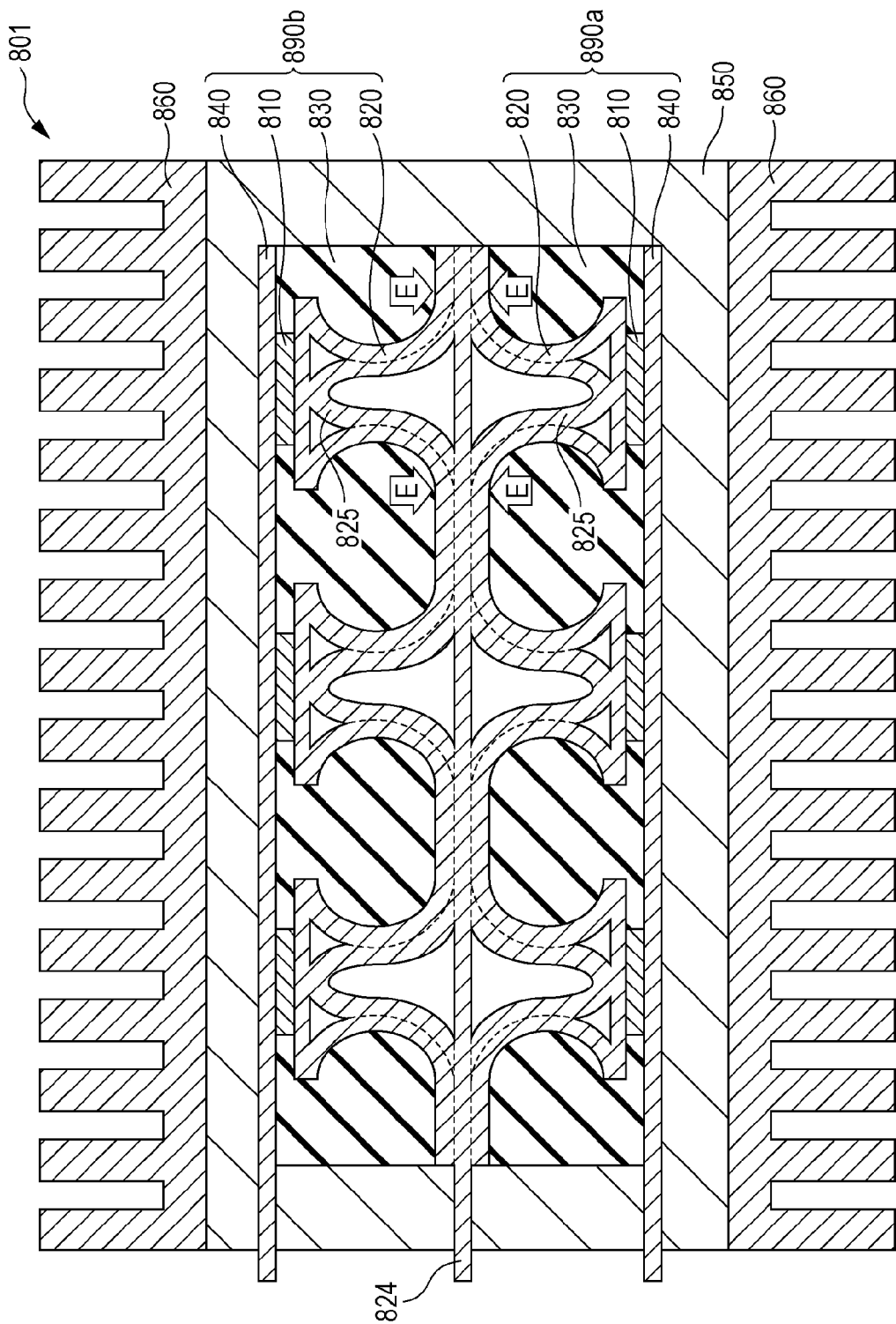
FIG. 14 is a cross-sectional view of an electronic device according to a second embodiment of the present disclosure.

FIG. 14 is a cross-sectional view of an electronic device 801 according to a second embodiment of the present disclosure. The electronic device 801 according to the second embodiment has a configuration in which one pair of constructs, each corresponding to a construct inside the case 50 with an auxiliary conductor 825 added of the electronic device 1 according to the first embodiment, is symmetrically arranged in a vertical direction. FIG. 14 shows an example in which three such pairs are provided in a lateral direction.

As shown in FIG. 14, in the second embodiment, power semiconductor devices 810, conductor-side electrodes (not shown), conductors 820, auxiliary conductors 825, insulators 830, and boards 840 are symmetrically arranged such that the conductors 820 and the auxiliary conductors 825 of each pair of constructs face each other. The conductors 820 arranged so as to face each other are electrically connected via a fourth conductor section 824 which is a conductor extending in a horizontal direction. Note that not only the conductor-side electrodes but also board-side electrodes are not shown in FIG. 14. The board 840 according to the second embodiment is a lead frame which is obtained by cutting a plate-like material in a pattern.

As for the configuration of the electronic device 801 described above, the power semiconductor device 810, the conductor-side electrode, the conductors 820, the insulator 830, and the board 840 that are arranged on the lower side constitute a first structure 890a which has the same configuration as that of a corresponding construct in the first embodiment and has the same vertical orientation. The power semiconductor device 810, the conductor-side electrode, the conductors 820, the insulator 830, and the board 840 that are arranged on the upper side constitute a second structure 890b which has the same configuration as that of a corresponding construct in the first embodiment and has an opposite vertical orientation. In the electronic device 801 in FIG. 14, the first structure 890a and the second structure 890b have third conductor sections 823 which are connected by the common fourth conductor section 824 and are arranged symmetrically with respect to the fourth conductor section 824.

As described above, the structures 890a and 890b inside the electronic device 801 are formed to be vertically symmetric, which allows more even stress occurrence inside the electronic device 801 (arrows E in FIG. 14) and enhancement of the reliability of the electronic device 801. That is, although stresses due to thermal expansion of the insulators 830 bring the upper and lower conductors 820 into close contact with the fourth conductor section 824, since the conductors 820 are arranged symmetrically with respect to the fourth conductor section 824, the stresses cancel one another. This reduces displacement and deformation due to stresses in the structures 890a and 890b.

The power semiconductor device 810, the board 840, a case 850, and a heat sink 860 are laid on top of each other in the vertical direction and are in contact, are connected, or are in close contact. With this configuration, a path from the power semiconductor device 810 to the heat sink 860 is short. This makes it easier to transfer generated heat from the power semiconductor device 810 to the heat sink 860 and allows enhancement of heat dissipation.

The auxiliary conductor 825 in contact with the conductor 820 helps the conductor 820 to, in particular, be effective as an electric wire. If the auxiliary conductor 825 is made of the same material as that for the conductor 820, production costs can be reduced, and streamlining of production can be achieved. Note that the conductor 820 and the auxiliary conductor 825 may be made of different materials and have different thicknesses.

The present disclosure has been described above in the context of the first and second embodiments. The present disclosure, however, is not limited to the first and second embodiments.

Note that appropriate combination of arbitrary ones of the various embodiments and modifications allows production of effects of the ones.

The features of an electronic device and a method for manufacturing the electronic device according to the present disclosure can be utilized, and the electronic device and the manufacturing method can be implemented on electric equipment, such as a power supply device which becomes hot. In particular, a compact, high-density, and heat-resistant power module for solderless connection or a power supply device can be constructed using a power semiconductor device. The present disclosure is not limited to this, and the electronic device and the manufacturing method can also be used in various terminal structures and connection structures in a board or the like.

What is claimed is:

1. An electronic device comprising:
    at least one component;
    an electrode which is placed on the at least one component;
    a conductor which includes a first conductor section and two second conductor sections connected by the first conductor section, the first conductor section including an electrode contact surface in contact with the electrode along a surface of the electrode, the two second conductor sections being physically connected to two respective edges of the first conductor section, extending in respective directions away from the electrode and including respective inclined surfaces inclined in directions toward a central axis passing through a center of the electrode and perpendicular to the surface of the electrode;
    an insulator which is in contact with the two second conductor sections from sides opposite to the central axis and encloses the conductor and the electrode;
    a case which houses the at least one component, the electrode, the conductor, and the insulator; and
    a board which is electrically connected to the at least one component and supports the at least one component, wherein:
    a space where the insulator is not arranged is defined between the two second conductor sections,
    the conductor further includes a third conductor section which is physically connected to an end on a side opposite to a connection with the first conductor section of each of the two second conductor sections to extend in a direction away from the central axis and faces the board,
    the insulator is arranged between the board and the third conductor section,
    the at least one component, the electrode, the conductor, the insulator, and the board compose each of at least two structures,
    the conductor further includes a fourth conductor section which electrically connects the third conductor sections of the at least two structures, and
    the at least two structures are arranged symmetrically with respect to the fourth conductor section.

2. The electronic device according to claim 1, wherein a coefficient of thermal expansion of the case is lower than a coefficient of thermal expansion of the conductor and is lower than a coefficient of thermal expansion of the insulator.

3. The electronic device according to claim 1, further comprising:
    an auxiliary conductor which is provided in the space and is in contact with the first conductor section.

4. The electronic device according to claim 1, wherein a coefficient of thermal expansion of the insulator is higher than a coefficient of thermal expansion of the conductor.

5. The electronic device according to claim 1, wherein:
    the at least one component comprises a plurality of components; and
    the first conductor section extends in a direction, in which the plurality of components are arrayed, and is electrically connected to the plurality of components.

6. The electronic device according to claim 1, wherein a thickness of each of the two second conductor sections is smaller than a thickness of the first conductor section.

7. The electronic device according to claim 1, wherein each of the respective inclined surfaces is flat.

8. The electronic device according to claim 1, wherein each of the respective inclined surfaces is curved.

9. A method for manufacturing an electronic device including at least one component, an electrode, a conductor having a first conductor section and two second conductor sections connected by the first conductor section, and an insulator, the method comprising:
- bringing the first conductor section of the conductor into contact with the electrode placed on the at least one component along a surface of the electrode;
- forming respective inclined surfaces which are inclined in directions toward a central axis passing through a center of the electrode and perpendicular to the surface of the electrode at the two second conductor sections of the conductor which are physically connected to two edges of the first conductor section, and extend in respective directions away from the electrode;
- enclosing the conductor and the electrode while bringing the insulator into contact with the two second conductor sections from sides opposite to the central axis;
- housing the at least one component, the electrode, the conductor, and the insulator in a case;
- preparing a board which supports the at least one component;
- arranging the board so as to face a third conductor section of the conductor which is physically connected to an end on a side opposite to a connection with the first conductor section of each of the two second conductor sections to extend in a direction away from the central axis;
- preparing at least two structures which are each composed of the at least one component, the electrode, the conductor, the insulator, and the board;
- connecting the third conductor sections of the at least two structures electrically by a fourth conductor section; and
- arranging the at least two structures symmetrically with respect to the fourth conductor section, wherein:
  - a space where the insulator is not arranged is defined between the two second conductor sections, and
  - the step of enclosing the conductor and the electrode in the insulator includes arranging the insulator between the board and the third conductor section.

10. The method for manufacturing the electronic device according to claim 9, wherein a coefficient of thermal expansion of the case is lower than a coefficient of thermal expansion of the conductor and is lower than a coefficient of thermal expansion of the insulator.

11. The method for manufacturing the electronic device according to claim 9, further comprising:
- providing an auxiliary conductor which is in contact with the first conductor section in the space.

12. The method for manufacturing the electronic device according to claim 9, wherein:
- the at least one component comprises a plurality of components; and
- the step of bringing the first conductor section into contact with the electrode includes connecting the first conductor section to the plurality of components electrically.

13. The method for manufacturing the electronic device according to claim 9, further comprising:
- curing the insulator that encloses the conductor.

* * * * *